(12) United States Patent
Tomioka (10) Patent No.: US 6,515,933 B2
(45) Date of Patent: Feb. 4, 2003

(54) SEMICONDUCTOR DEVICE AND SEMICONDUCTOR STORAGE DEVICE TESTING METHOD

(75) Inventor: Takanori Tomioka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 171 days.

(21) Appl. No.: 09/785,164

(22) Filed: Feb. 20, 2001

(65) Prior Publication Data

US 2002/0062473 A1 May 23, 2002

(30) Foreign Application Priority Data

Sep. 28, 2000 (JP) ........................................ 2000-295570

(51) Int. Cl.$^7$ ................................................ G11C 7/00
(52) U.S. Cl. .................. 365/226; 365/189.09; 365/200; 365/225.7
(58) Field of Search ................................ 365/200, 201, 365/225.7, 226, 230.06, 189.09

(56) References Cited

U.S. PATENT DOCUMENTS

| | | | | |
|---|---|---|---|---|
| 4,687,951 A | * | 8/1987 | McElroy | .................. 365/225.7 |
| 5,847,597 A | * | 12/1998 | Ooishi et al. | .......... 365/189.09 |
| 6,434,070 B1 | * | 8/2002 | Itoo et al. | .................... 365/201 |
| 6,449,207 B2 | * | 9/2002 | Sher et al. | .................. 365/226 |

FOREIGN PATENT DOCUMENTS

| | | |
|---|---|---|
| JP | 62-291799 | 12/1987 |
| JP | 11-86587 | 3/1999 |

* cited by examiner

*Primary Examiner*—Tan T. Nguyen
(74) *Attorney, Agent, or Firm*—McDermott, Will & Emery (57) ABSTRACT

In a variable resistance circuit included in a internal power supply potential generation circuit of a DRAM, to a fuse for tuning an internal power supply potential, an N channel MOS transistor is connected in parallel. In a pre-LT state return mode, a mode setting signal attains a "H" level to render the N channel MOS transistor conductive, so that the same state as that where no fuse is cut off is established to return the internal power supply potential to a level at a wafer test. It is therefore possible to quickly and accurately review wafer test conditions after a final test.

5 Claims, 6 Drawing Sheets

FIG.8A /PC
FIG.8B X0
FIG.8C φH
FIG.8D φR
FIG.8E SWL
FIG.8F WL

TIME t →

FIG.9A /PC
FIG.9B X0
FIG.9C φH
FIG.9D φR
FIG.9E SWL
FIG.9F WL

TIME t →

FIG.10

SEMICONDUCTOR DEVICE AND SEMICONDUCTOR STORAGE DEVICE TESTING METHOD

BACKGROUND OF THE INVENTION

1. Field of the Invention

The present invention relates to a semiconductor device and a semiconductor storage device testing method and, more particularly, to a semiconductor device having an internal power supply voltage generation circuit and a method of testing a semiconductor storage device having a spare memory cell.

2. Description of the Background Art

For such a semiconductor memory as a dynamic random access memory (hereinafter referred to as DRAM), it is a conventional practice to conduct two stages of tests, a wafer test and a final test.

In the wafer test, with numerous memory chips formed on a semiconductor wafer and a test probe made in contact with a pad of each memory chip, a test is performed to determine whether each memory cell of each memory chip is normal or not under predetermined wafer test conditions. On a remediable memory chip, a defective memory cell row or column is replaced by a spare memory cell row or column by selectively cutting off a group of fuses on the chip. In addition, by selectively cutting off another group of fuses on the chip, tuning of an internal power supply potential intVCC is conducted.

Next, a normal memory chip and a remedied memory chip are cut out from the semiconductor wafer and incorporated into a package to make a DRAM product. In the final test, with each DRAM product mounted on a test board, a test is performed to determine whether each memory cell of each DRAM product is normal or not under predetermined final test conditions. Normal DRAM products are shipped, while DRAM products having a newly found defective memory cell are subjected to an analysis of a defective mode.

Difference in results of a wafer test and a final test derives from different test conditions. While in a wafer test, with a test probe attached to a pad of each DRAM chip, a simple test is performed, a final test is conducted with each DRAM product mounted on a test board under conditions severer than conditions of actual use. Since it is desirable that results of the wafer test and the final test coincide with other, it is a conventional practice to analyze the results of the final test and feed back the analysis results into wafer test conditions.

With respect to defective DRAM products, however, since laser trimming of a fuse is already conducted and cut off fuses can not be restored, defective DRAM products can not be precisely analyzed.

More specifically, since before and after the tuning of an internal power supply potential intVCC, the internal power supply potential intVCC has a potential change of 0.1 to 0.4V, even if new voltage conditions for a wafer test are obtained by analyzing a defective DRAM product, the conditions are in many cases inappropriate.

In addition, since a defective memory cell row or column is replaced by a spare memory cell row or column, it is impossible to detect how many defective memory cells exist in the replaced memory cell row or column even by testing a defective DRAM product under various wafer test conditions and accordingly impossible to conduct accurate analyses.

SUMMARY OF THE INVENTION

An object of the present invention is to provide a semiconductor device and a semiconductor storage device testing method enabling review of wafer test conditions to be executed appropriately in a short time period.

The semiconductor device according to the present invention is provided with an internal power supply voltage generation circuit for generating an internal power supply voltage based on an external power supply voltage, at least one first fuse coupled to the internal power supply voltage generation circuit for adjusting a level of the internal power supply voltage, a first switching element connected in parallel to the at least one first fuse and responsive to an instruction of an initial state return mode to become conductive for returning the level of the internal power supply voltage to an initial value, and an internal circuit driven by the internal power supply voltage. Therefore, even when after the first fuse is cut off to conduct a final test, a defective part is newly detected in the internal circuit, the device can be returned to a state at a wafer test by rendering the first switching element conductive, so that wafer test conditions can be appropriately reviewed in a short time period.

The internal power supply voltage generation circuit preferably includes a constant-current source for outputting a predetermined constant current and a plurality of resistance elements connected in series between an output node of the constant-current source and a line of a reference potential, to any of which plurality of resistance elements, the at least one fuse is connected in parallel. In this case, cutting off the fuse results in increasing a value of a resistance between the output node and the reference potential line to increase the internal power supply voltage.

Also preferably, the semiconductor device is a semiconductor storage device and the internal circuit includes a plurality of memory cells, a spare memory cell for replacing a defective memory cell, a decoder provided corresponding to each memory cell and responsive to application of an address signal assigned to a corresponding memory cell for activating the corresponding memory cell, and at least one second fuse for programming an address signal assigned to a defective memory cell, and includes a redundant decoder responsive to application of a programmed address signal for inactivating the decoder, as well activating the spare memory cell, a second switching element connected in parallel to the at least one second fuse and responsive to an instruction of the initial state return mode to become conductive for temporarily erasing a programmed address signal, and a write/read circuit for writing/reading data to/from memory cells activated by the decoder and the redundant decoder. In this case, since even when after the first and the second fuses are cut off to conduct the final test, a defective memory cell is newly detected, the device can be returned to a state at the wafer test by rendering the first and the second switching elements conductive, wafer test conditions can be reviewed appropriately in a short time period.

In a method of testing a semiconductor storage device according to the present invention, the semiconductor storage device includes a plurality of memory cells, a spare memory cell for replacing a defective memory cell, a decoder provided corresponding to each memory cell and responsive to application of an address signal assigned to a corresponding memory cell for activating the corresponding memory cell, and at least one first fuse for programming an address signal assigned to a defective memory cell, and includes a redundant decoder responsive to application of a programmed address signal for inactivating the decoder, as well activating the spare memory, a first switching element connected in parallel to the at least one first fuse and responsive to an instruction of the initial state return mode to become conductive for temporarily erasing a programmed address signal, and a write/read circuit for writing/reading data to/from memory cells activated by the decoder and the redundant decoder. Then, with the semiconductor storage device formed on a semiconductor wafer, a test is performed to determine whether each memory cell is normal or not under first test conditions and when a defective memory cell is detected, the at least one first fuse is cut off to replace the defective memory cell by the spare memory cell. Next, the semiconductor storage device is cut out from the semiconductor wafer and accommodated in a package and with the device accommodated, a test is performed to determine whether each memory cell is normal or not under second test conditions and when a defective memory cell is newly detected, the initial state return mode is instructed to render the first switching element conductive to review the first test conditions. Accordingly, even when after the first fuse is cut off to conduct the final test, a defective memory cell is newly detected, the device can be returned to a state at the wafer test by rendering the first switching element conductive, so that the first test conditions, that is, wafer test conditions can be reviewed appropriately in a short time period.

Preferably, the semiconductor storage device further includes an internal power supply voltage generation circuit for generating an internal power supply voltage for driving the decoder, the redundant decoder and the write/read circuit based on an external power supply voltage, at least one second fuse coupled to the internal power supply voltage generation circuit for adjusting a level of the internal power supply voltage and a second switching element connected in parallel to the at least one second fuse and responsive to an instruction of the initial state return mode to become conductive for returning the level of the internal power supply voltage to an initial value. Then, at the time when the at least one first fuse is cut off, the at least one second fuse is also cut off and at the time when the first switching element is rendered conductive, the second switching element is also rendered conductive. In this case, since even when after the first and the second fuses are cut off to conduct the final test, a defective memory cell is newly detected, the device can be returned to a state at the wafer test by rendering the first and the second switching elements conductive, the first test conditions, that is, wafer test conditions, can be appropriately reviewed in a short time period.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
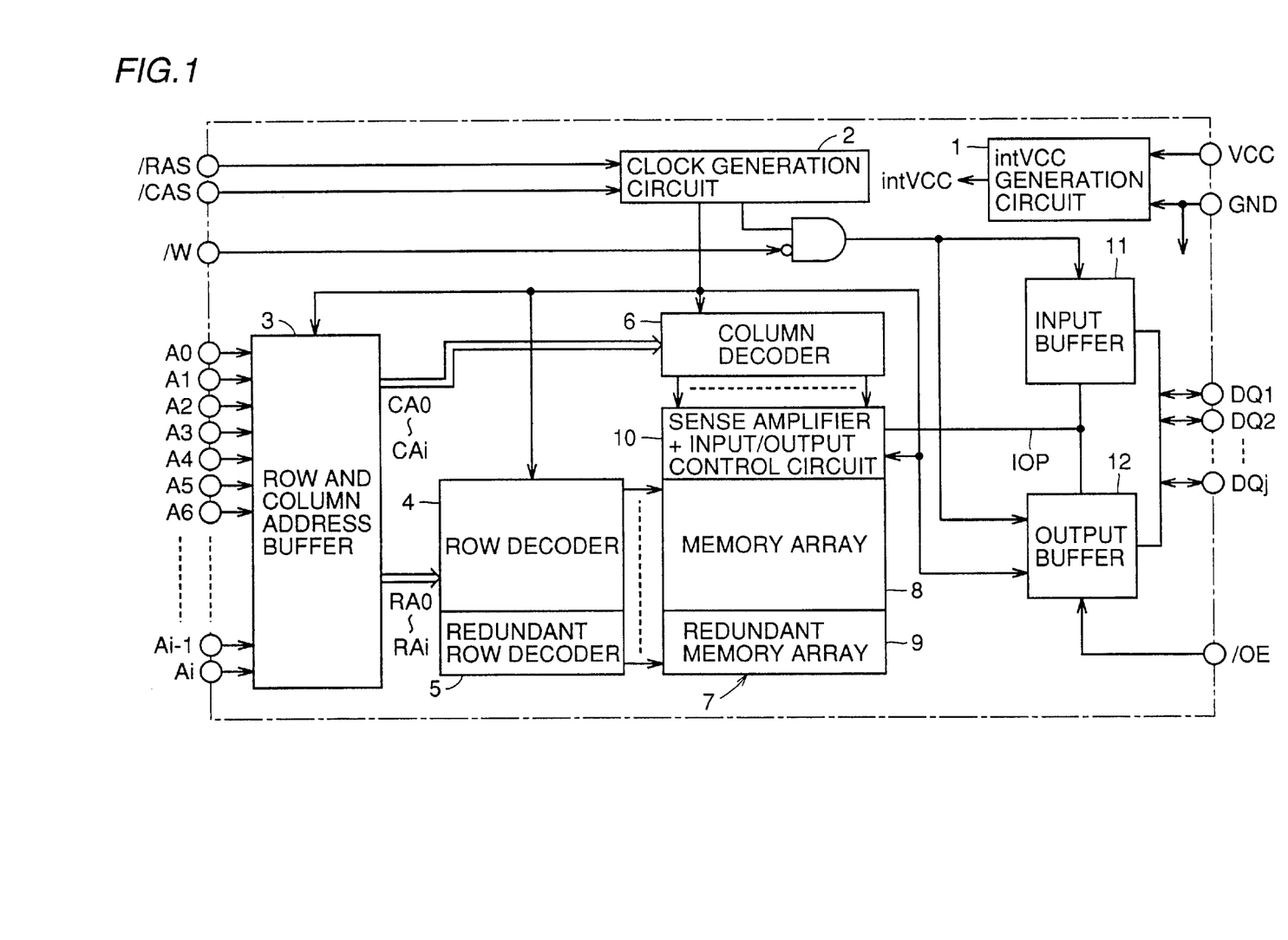
FIG. 1 is a block diagram showing an entire structure of a DRAM according to one embodiment of the present invention.

FIG. 1 is a block diagram showing a structure of a DRAM according to one embodiment of the present invention. First, structure and operation of the entire DRAM will be described. With reference to FIG. 1, the DRAM includes an internal power supply potential (intVCC) generation circuit 1, a clock generation circuit 2, a row and column address buffer 3, a row decoder 4, a redundant row decoder 5, a column decoder 6, a memory mat 7, an input buffer 11 and an output buffer 12, and the memory mat 7 includes a memory array 8, a redundant memory array 9 and a sense amplifier+input/output control circuit 10.

The internal power supply potential generation circuit 1 receives an external power supply potential VCC and a ground potential GND to generate an internal power supply potential intVCC lower than the external power supply potential VCC and apply the same to the entire DRAM. The internal power supply potential intVCC can be tuned by a group of fuses provided in the internal power supply potential generation circuit 1. The clock generation circuit 2 selects a predetermined operation mode to control the entire DRAM based on externally applied signals /RAS and /CAS.

The row and column address buffer 3 generates row address signals RA0 to RAi and column address signals CA0 to CAi based on externally applied address signals A0 to Ai (i: an integer not less than 0) and applies the generated signals RA0 to RAi and CA0 to CAi to the row decoders 4 and 5 and the column decoder 6, respectively.

The memory array 8 includes a plurality of memory cells disposed in a matrix each for storing 1-bit data. Each memory cell is arranged at a predetermined address determined by a row address and a column address.

The row decoder 4 designates a row address of the memory array 8 in response to the row address signals RA0 to RAi applied from the row and column address buffer 3. Provided in the redundant row decoder 5 is a group of fuses for programming a row address containing a defective memory cell in the memory array 8 and a row address replacing the row address in question in the redundant memory array 9. When the row address signal RA0 to RAi corresponding to the defective row address programmed by the group of fuses is applied, the row decoder 4 refrains from designating the row address in question and the redundant row decoder 5 designates a row address of the redundant memory array 9 programmed in place of the row address in question. In other words, a defective memory cell row containing a defective memory cell in the memory array 8 is replaced by a normal memory cell row in the redundant memory array 9.

The column decoder 6 designates a column address of the memory array 8 in response to the column address signals CA0 to CAi applied from the row and column address buffer 3. The sense amplifier+input/output control circuit 10 connects a memory cell at an address designated by the row decoder 4 (or the redundant row decoder 5) and the column decoder 6 to one end of a data input/output line pair IOP. The other end of the data input/output line pair IOP is connected to the input buffer 11 and the output buffer 12. The input buffer 11, in a writing mode, applies eternally applied data Dj (j: natural number) to a memory cell selected through the data input/output line pair IOP in response to an externally applied signal /W. The output buffer 12, in a reading mode, externally outputs read data Qi from a selected memory cell in response to an externally applied signal /OE.

Figure 2:
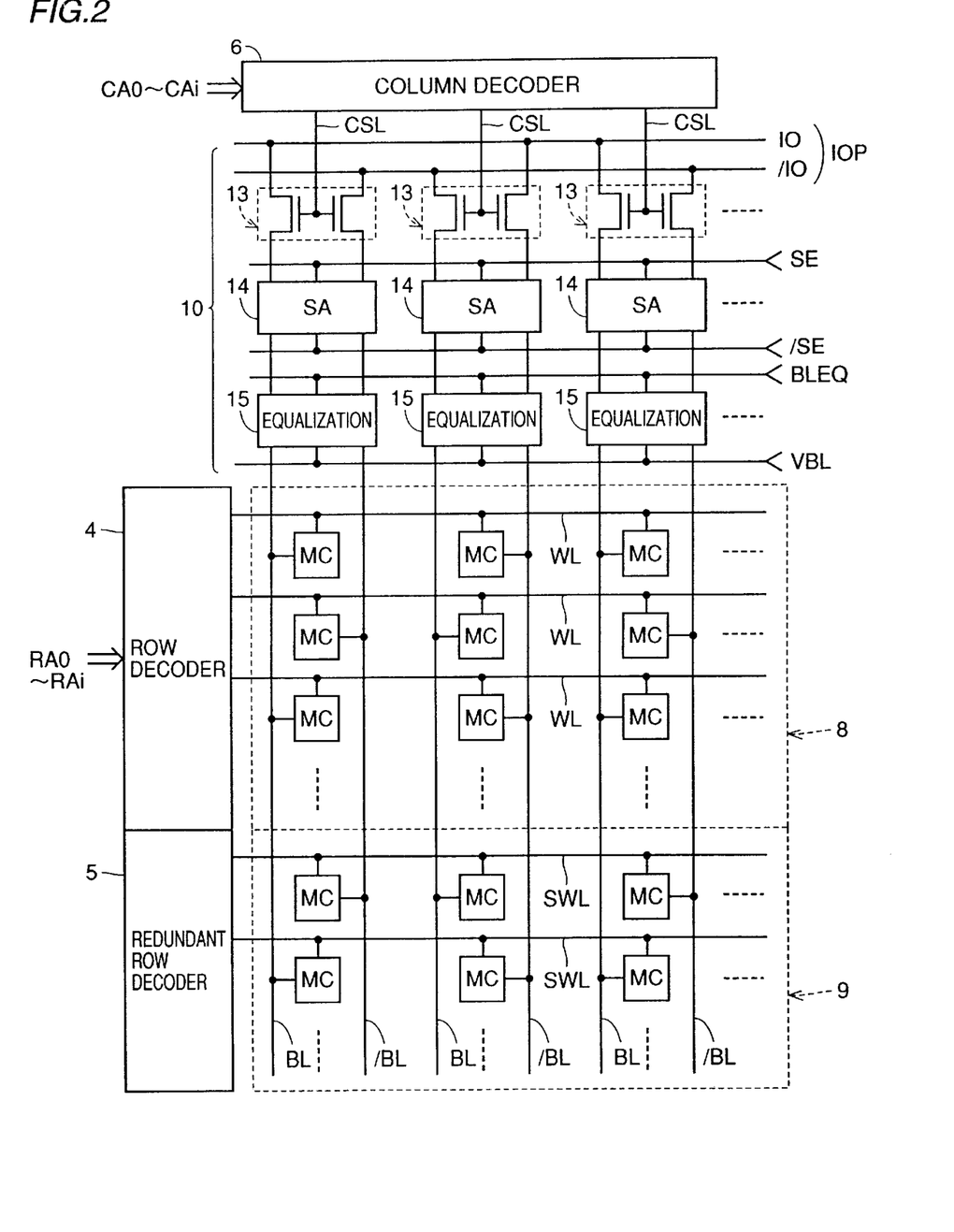
FIG. 2 is a circuit block diagram showing a structure of a memory mat illustrated in FIG. 1.

FIG. 2 is a circuit block diagram showing a part of the structure of the memory mat 7 of the DRAM illustrated in FIG. 1.

In FIG. 2, the memory array 8 includes a plurality of memory cells MC disposed in a matrix, a word line WL provided corresponding to each row, and a bit line pair BL, /BL provided corresponding to each column.

Each memory cell MC is a well known memory cell including an N channel MOS transistor for access and a capacitor for storing information. The word line WL transmits output of the row decoder 4 to activate a memory cell MC in a selected row. The bit line pair BL, /BL inputs and outputs a data signal to and from a selected memory cell MC.

The redundant memory array 9 has the same structure as that of the memory array 8 with the only difference being that the number of rows is smaller than that of the memory array 8. The memory array 8 and the redundant memory array 9 have the same number of columns and the bit line pair BL, /BL is shared by the memory array 8 and the redundant memory array 9. The word line of the redundant memory array 9 is assumed to be a spare word line SWL.

The sense amplifier+input/output control circuit 10 includes the data input/out line pair IO, /IO (IOP), a column selection gate 13, a sense amplifier 14 and an equalizer 15 provided corresponding to each column. The column selection gate 13 includes a pair of N channel MOS transistors connected between the bit line pair BL, /BL and the data input/output line pair IO, /IO. Gates of a pair of the N channel MOS transistors of each column selection gate are connected to the column decoder 6 through a column selection line CSL. When the column selection line CSL is brought to a logical high or "H" level of a selection level by the column decoder 6, a pair of N channel MOS transistors is rendered conductive to couple the bit line pair BL, /BL and the data input/output line pair IO, /IO.

In response to sense amplifier activating signals SE, /SE attaining the "H" level and a logical low or "L" level, respectively, the sense amplifier 14 amplifies a small potential difference between the bit line pair BL, /BL to the internal power supply voltage intVCC. In response to a bit line equalizing signal BLEQ attaining an "H" level of an activation level, the equalizer 15 equalizes a potential of the bit line pair BL, /BL to a bit line potential VBL (=intVCC/2).

Next, operation of the DRAM shown in FIGS. 1 and 2 will be described. In the writing mode, the column decoder 6 brings a column selection line CSL in a column corresponding to the column address signal CA0 to CAi to the "H" level of the selection level to render the column selection gate 13 of the column in question conductive.

The input buffer 11 applies the external write data Dj to the bit line pair BL, /BL of a selected column through the data input/out line pair IOP in response to the signal /W. The write data Dj is applied as a potential difference between the bit lines BL and /BL. Next, the row decoder 4 brings a word line WL in a row corresponding to the row address signal RA to RAi to the "H" level of the selection level, so that an N channel MOS transistor of the memory cell MC in the row in question becomes conductive. In a capacitor of the selected memory cell MC, electric charges are accumulated whose amount corresponds to a potential of the bit line BL or /BL.

In the reading mode, first the bit line equalizing signal BLEQ rises to the "L" level to stop equalization of the bit lines BL and /BL. Then, the row decoder 4 brings a word line WL in a row corresponding to the row address signal RA0 to RAi to the "H" level of the selection level, so that an N channel MOS transistor of the memory cell MC in the row in question becomes conductive. Responsively, the potentials of the bit lines BL and /BL change a little according to the amount of electric charges in the capacitor of the activated memory cell MC.

Next, the sense amplifier activating signals SE and /SE attain the "H" level and the "L" level, respectively, to activate the sense amplifier 14. When the potential of the bit line BL is a little higher than the potential of the bit line /BL, the potential of the bit line BL is brought to the "H" level and the potential of the bit line /BL is brought down to the "L" level. Conversely, when the potential of the bit line /BL is a little higher than the potential of the bit line BL, the potential of the bit line /BL is brought down to the "H" level and the potential of the bit line BL is brought down to the "L" level.

Next, the column decoder 6 brings a column selection line CSL in a column corresponding to the column address signal CA0 to CAi to the "H" level of the selection level to render the column selection gate 13 of the column in question conductive. Data of the bit line pair BL, /BL of the selected column is applied to the output buffer 12 through the column selection gate 13 and the data input/output line pair IO, /IO. The output buffer 12 externally outputs the read data Qi in response to the signal /OE.

When the row address signal RA0 to RAi corresponds to a row containing a defective memory cell MC, the spare word line SWL of the redundant memory array 9 is selected in place of the word line WL in the row containing the defective memory cell MC and the writing and reading operation is similarly conducted. Thus, such a semiconductor memory as a DRAM adopts a method of replacing defective rows and columns by spare rows and columns in order to improve a rate of good chips on a semiconductor wafer. In the following, detailed description will be made of a part related to a wafer test and a final test as characteristics of the present invention.

Figure 3:
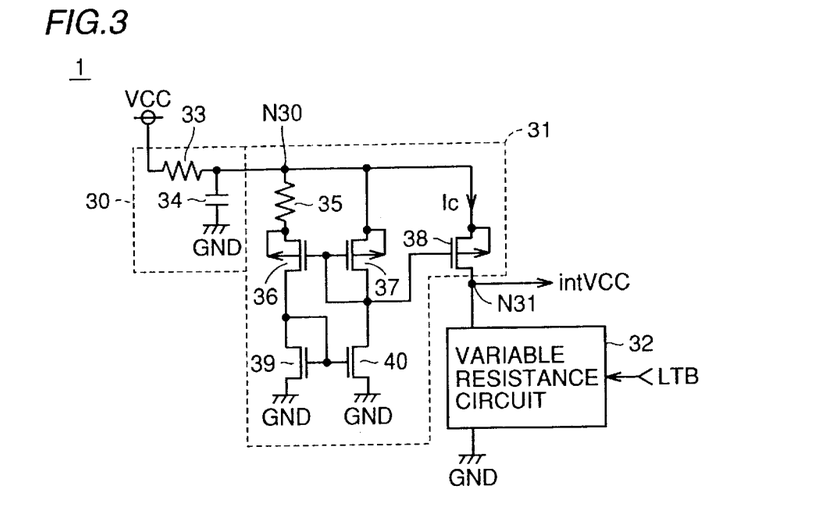
FIG. 3 is a circuit block diagram showing a structure of an internal power supply potential generation circuit illustrated in FIG. 1.

FIG. 3 is a circuit block diagram showing the structure of the internal power supply potential generation circuit 1. In FIG. 3, the internal power supply potential generation circuit 1 includes a low-pass filter 30, a constant-current source 31 and a variable resistance circuit 32.

The low-pass filter 30 includes a resistance element 33 and a capacitor 34. The resistance element 33 is connected between the line of the external power supply potential VCC and a node N30 and the capacitor 34 is connected between the node N30 and the line of the ground potential GND. The external power supply potential VCC is applied to the node N30 through the resistance element 33.

The constant-current source 31 includes a resistance element 35, P channel MOS transistors 36 to 38 and N channel MOS transistors 39 and 40. The resistance element 35 and the MOS transistors 36 and 39, the MOS transistors 37 and 40, and the MOS transistor 38 and the variable resistance circuit 32 are respectively connected in series between the node N30 and the line of the ground potential GND. Gates of the P channel MOS transistors 36 to 38 are all connected to a drain of the P channel MOS transistor 37. Gates of the N channel MOS transistors 39 and 40 are both connected to a drain of the N channel MOS transistor 39. The P channel MOS transistor 36 to 38 and the N channel MOS transistors 39 and 40 form current-mirror circuits, respectively. To the P channel MOS transistor 38, a constant current Ic flows which has a value corresponding to a resistance value of the resistance element 35, to a size ratio of the P channel MOS transistors 36 to 38 or the like.

Figure 4:
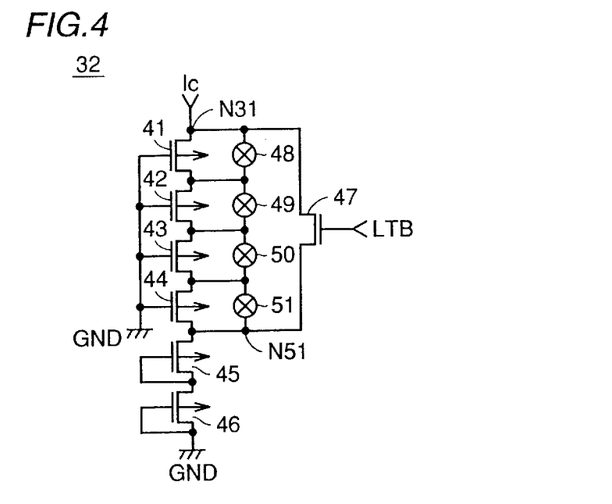
FIG. 4 is a circuit diagram showing a structure of a variable resistance circuit illustrated in FIG. 3.

The variable resistance circuit 32, as illustrated in FIG. 4, includes a plurality (four in the figure) of P channel MOS transistors 41 to 44 connected in series between an output node N31 (drain of the P channel MOS transistor 38) of the constant-current source 31 and a node 51, and a plurality (two in the figure) of P channel MOS transistors 45 and 46 connected in series between the node N51 and the line of the ground potential GND. Gates of the P channel MOS transistors 41 to 44 are all grounded and gates of the P channel MOS transistors 45 and 46 are connected to their own drains. Each of the P channel MOS transistors 41 to 44 forms a resistance element and each of the P channel MOS transistors 45 and 46 forms a diode element.

The variable resistance circuit 32 further includes fuses 48 to 51 connected in parallel to the P channel MOS transistors 41 to 44 and an N channel MOS transistor 47 connected between the nodes N31 and N51 and having a gate receiving a signal LTB. The signal LTB is a signal which attains a "L" level of an inactivation level in ordinary operation and attains the "H" level of the activation level in a mode for returning to a state prior to laser trimming (LT). The pre-LT state return mode is a mode for returning the DRAM to a state before the fuses 48 to 51 are cut off by laser trimming, which is set by a so-called address key.

In ordinary operation, the signal LTB attains the "L" level of the inactivation level to render the N channel MOS transistor 47 non-conductive. At this time, assume that a value of a resistance between the nodes N31 and N51 is denoted as R and each threshold voltage of the P channel MOS transistors 45 and 46 is denoted as Vth, the internal power supply potential intVCC will be expressed as 2×Vth+ R×Ic. Since the P channel MOS transistors 41 to 44 have resistance values different from each other, the internal power supply potential intVCC can be tuned at a stage of $2^4=16$ by cutting off or not cutting off each of the fuses 48 to 51. In the pre-LT state return mode, the signal LTB attains the "H" level of the activation level to render the N channel MOS transistor 47 conductive, so that a value of the resistance between the nodes N31 and N51 is returned to a value at a state before cut-off of the fuses 48 to 51.

Figure 5:
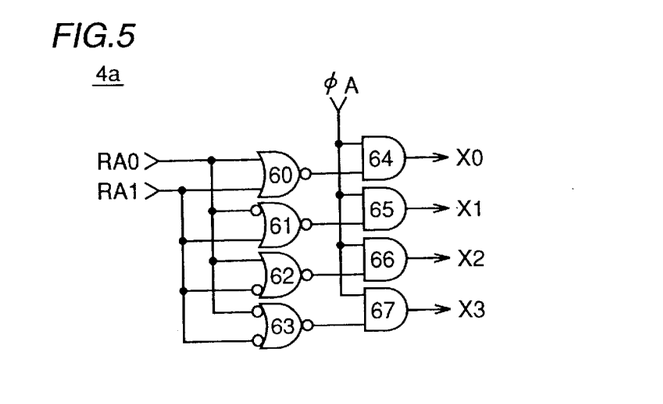
FIG. 5 is a circuit diagram showing a structure of a predecoder included in a row decoder illustrated in FIG. 1.

FIG. 5 is a circuit diagram showing a structure of a predecoder 4a included in the row decoder 4. In the following, the predecoder is provided with four word lines WL and one spare word line SWL for the simplicity of illustration and description.

In FIG. 5, the predecoder 4a includes gate circuits 60 to 63 and AND gates 64 to 67. Each of the gate circuits 60 to 63 receives the row address signals RA0 and RA1. The gate circuit 60 outputs a "H" level (1) only when both of the signals RA0 and RA1 are at a "L" level (0). The gate circuit 61 outputs the "H" level only when the address signals RA0 and RA1 are at the "H" level and the "L" level, respectively. The gate circuit 62 outputs the "H" level only when the signals RA0 and RA1 are at the "L" level and the "H" level, respectively. The gate circuit 63 outputs the "H" level only when the signals RA0 and RA1 are both at the "H" level.

Output signals of the gate circuits 60 to 63 are applied to ones of input nodes of the AND gates 64 to 67, respectively. To the other input nodes of the AND gates 64 to 67, a signal φA is applied. The signal φA is a signal which attains the "L" level in a stand-by mode and the "H" level in an active mode. Output signals of the AND gates 64 to 67 become predecoding signals X0 to X3, respectively. The predecoding signals X0 to X3 are assigned to the four word lines WL, respectively.

At the stand-by, the signals X0 to X3 attain the "L" level. In the active mode, one of the signals X0 to X3 attains the "H" level (1) according to the row address signals RA0 and RA1 as shown in the table below.

TABLE 1

| RA0 | RA1 | X0 | X1 | X2 | X3 |
|-----|-----|----|----|----|----|
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 |

Figure 6:
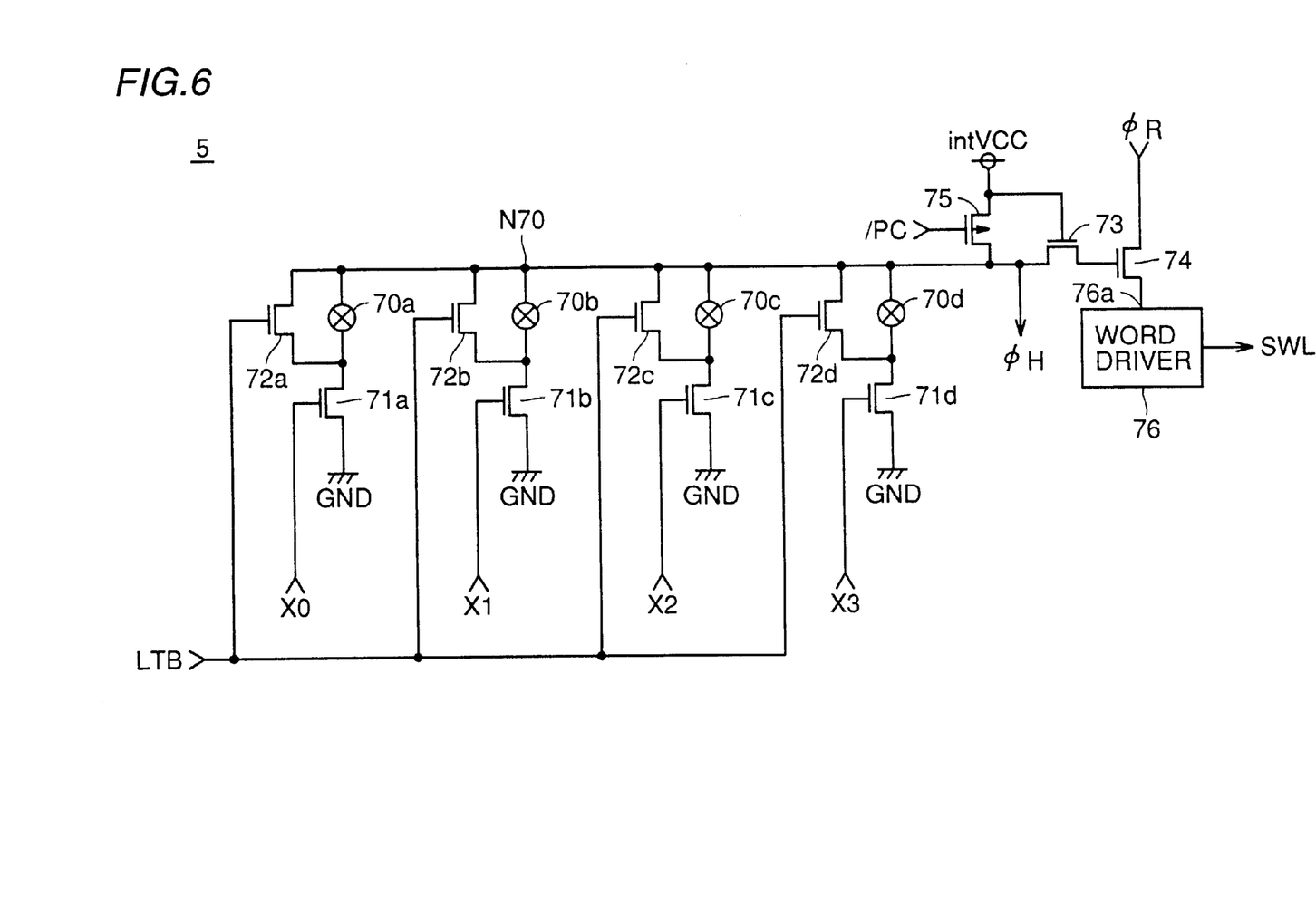
FIG. 6 is a circuit block diagram showing a structure of a redundant row decoder illustrated in FIG. 1.

FIG. 6 is a circuit block diagram showing the structure of the redundant row decoder 5. In FIG. 6, the redundant row decoder 5 includes fuses 70a to 70d, N channel MOS transistors 71a to 71d, 72a to 72d, 73 and 74, a P channel MOS transistor 75 and a word driver 76.

The P channel MOS transistor 75 is connected between the line of the internal power supply potential intVCC and a node N70 and has a gate receiving a precharging signal /PC. In the stand-by mode, the signal /PC attains a "L" level of the activation level and in the activation mode, attains the "L" level of the activation level only for a predetermined time before the word lines WL and SWL are selected. When the signal /PC attains the "L" level of the activation level, the P channel MOS transistor 75 is rendered conductive to precharge the node N70 to the "H" level.

Ones of terminals of the fuses 70a to 70d are all connected to the node N70. The N channel MOS transistors 71a to 71d are connected between the other terminals of the fuses 70a to 70d and the line of the ground potential, respectively, and have gates receiving the signals X0 to X3, respectively. The N channel MOS transistors 72a to 72d are connected in parallel to the fuses 70a to 70c and have gates receiving the signal LTB.

The fuses 70a to 70d are assigned to four word lines WL. Each of the fuses 70a to 70d, when its corresponding word line WL is defective, is cut off in a case of replacing the word line WL in question with the spare word line SWL. Only one of the fuses 70a to 70d can be cut off.

When any one of the signals X0 to X3 (e.g. X0) attains the "H" level of the activation level according to the row address signals RA0 and RA1, the N channel MOS transistor 71a corresponding to the signal X0 is rendered conductive. When the fuse 70a corresponding to the signal X0 is not cut off, the level of the node N70 is brought down from the "H" level to the "L" level, while when the fuse 70a is cut off, the level of the node N70 remains unchanged. The signal appearing on the node N70 will be a hit signal φH. In the pre-LT state return mode, the signal LTB attains the "H" level of the activation level to render the N channel MOS transistors 72a to 72d conductive, so that the redundant row decoder 5 becomes equivalent to a state where none of the fuses 70a to 70d is cut off. Accordingly, in the pre-LT state return mode, the hit signal φH is brought from the "H" down to the "L" level without fail.

The N channel MOS transistor 73 is connected between the node N70 and a gate of the N channel MOS transistor 74 and has a gate receiving the internal power supply potential intVCC. The N channel MOS transistor 73 is provided for protecting the N channel MOS transistor 74. The N channel MOS transistor 74 has a drain receiving a word line selecting signal φR and a source connected to a control node 76a of the word driver 76. The word driver 76 brings the spare word line SWL to a "L" level of a non-selected level when the control node 76a is at the "L" level and brings the spare word line SWL to the "H" level of the selection level when the control node 76a is at the "H" level.

Figures 7, 8A, 8B, 8C:
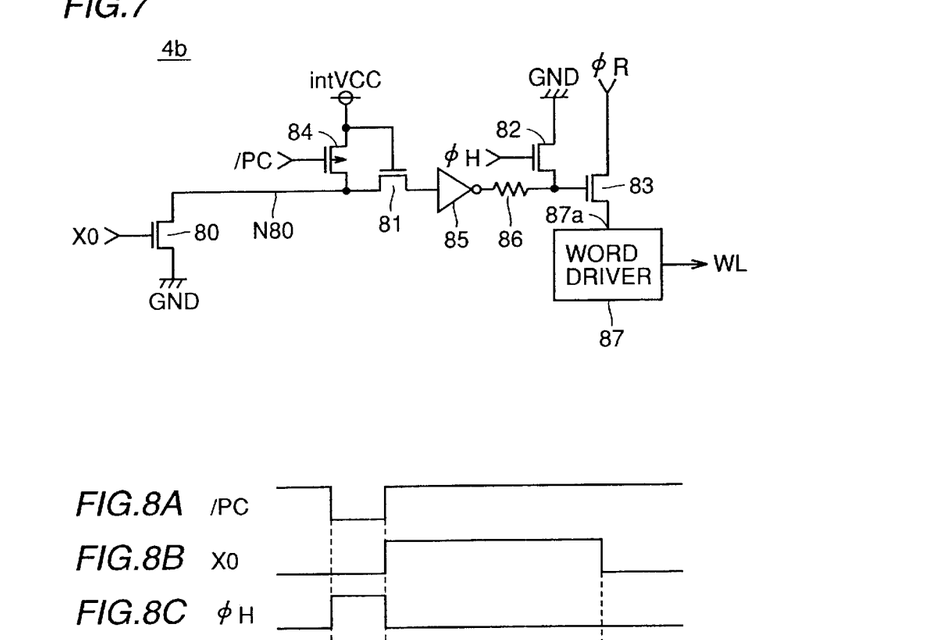
FIG. 7 is a circuit block diagram showing a structure of a row decoder unit circuit included in the row decoder illustrated in FIG. 1.
FIGS. 8A to 8F are time charts showing row selection operation of the DRAM illustrated in FIGS. 1 to 7.
Figures 8D, 8E:
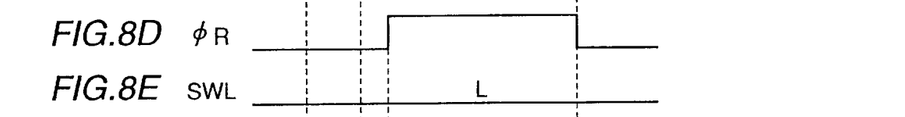
Figure 8F:
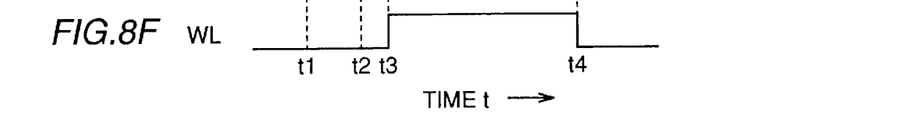
Figures 9A, 9B:
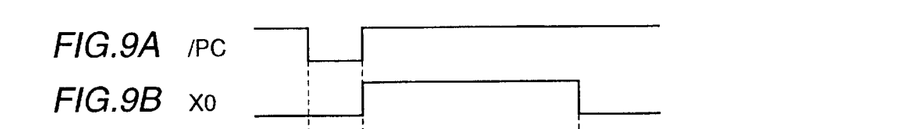
FIGS. 9A to 9F are other time charts showing row selection operation of the DRAM illustrated in FIGS: 1 to 7.
Figures 9C, 9D:
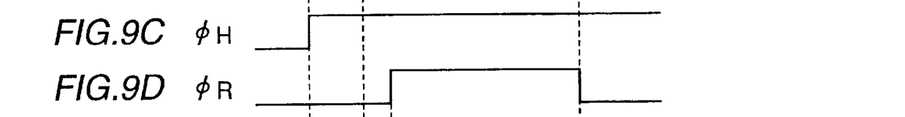
Figures 9E, 9F:
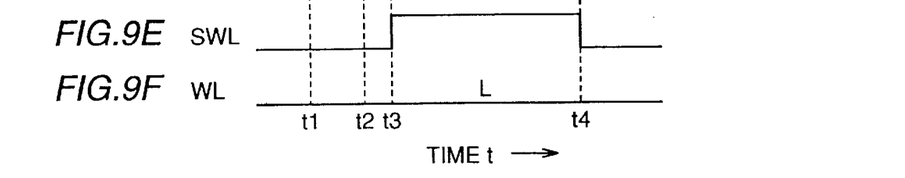

FIG. 7 is a circuit block diagram showing a structure of a row decoder unit circuit 4a included in the row decoder 4. The row decoder unit circuit 4a is provided corresponding to each word line WL. Illustrated in FIG. 7 is the row decoder unit circuit 4a corresponding to a word line WL to which the predecoding signal X0 is assigned. In FIG. 7, the row decoder unit circuit 4a includes N channel MOS transistors 80 to 83, a P channel MOS transistor 84, an inverter 85, a resistance element 86 and a word driver 87.

The P channel MOS transistor 84 is connected between the line of the internal power supply potential intVCC and a node N80 and has a gate receiving the precharging signal /PC. When the signal /PC maintains the "L" level of the activation level for a fixed time period, the P channel MOS transistor 84 is rendered conductive to precharge the node N80 to the "H" level.

The N channel MOS transistor 80 is connected between the node N80 and the line of the ground potential GND and has a gate receiving the corresponding predecoding signal X0. When the signal X0 attains the "H" level of the activation level, the N channel MOS transistor 80 is rendered conductive, so that the level of the node N80 falls from the "H" level to the "L" level.

The N channel MOS transistor 81 is connected between the node N80 and an input node of the inverter 85 and has a gate receiving the internal power supply potential intVCC. The N channel MOS transistor 81 is provided for protecting the inverter 85. An output signal of the inverter 85 is applied to a gate of the N channel MOS transistor 83 through the resistance element 86. The N channel MO transistor 82 is connected between the gate of the N channel MOS transistor 83 and the line of the ground potential GND and has a gate receiving the hit signal φH. When the hit signal φH is at the "H" level of the activation level, the N channel MOS transistor 82 is rendered conductive to bring the gate of the N channel MOS transistor 83 to the "L" level, so that the N channel MOS transistor 83 is rendered conductive. In the pre-LT state return mode, since the hit signal φH is brought down from the "H" level to the "L" level without fail, the N channel MOS transistor 84 is rendered non-conductive, so that the level of an output signal of the inverter 85 is transmitted as it is to the gate of the N channel MOS transistor 83.

The N channel MOS transistor 83 has a drain receiving the word line selecting signal φR and a source connected to a control node 87a of the word driver 87. The word driver 87 brings the corresponding word line WL to the "L" level of the non-selected level when the control node 87a is at the "L" level and brings the corresponding word line WL to the "H" level of the selection level when the control node 87a is at the "H" level.

Next, operation of the row decoders 4 and 5 shown in FIGS. 5 to 7 will be described. FIGS. 8A to 8F are time charts showing operation conducted when the word line WL corresponding to the predecoding signal X0 is normal and the normal word line WL is selected. In this case, the fuse 70a corresponding to the signal X0 will not be cut off.

First, at time t1, when the precharging signal /PC falls to the "L" level of the activation level, the P channel MOS transistor 75 in FIG. 6 is rendered conductive to bring the level of the node N70, that is, the hit signal φH, to the "H" level, and the P channel MOS transistor 84 in FIG. 7 is rendered conductive to bring the level of the node N80 to the "H" level.

Next, at time t2, the precharging signal /PC is brought to the "H" level of the inactivation level to render the P channel MOS transistors 75 and 84 non-conductive, so that precharging of the nodes N70 and N80 is stopped. At the same time, the predecoding signal X0 is brought to the "H" level of the activation level to render the N channel MOS transistor 71a in FIG. 6 conductive to bring the signal φH down to the "L" level and render the N channel MOS transistor 80 in FIG. 7 conductive to bring the node N80 to the "L" level. As a result, the N channel MOS transistor 74 in FIG. 6 becomes non-conductive, while the N channel MOS transistor 83 of FIG. 7 becomes conductive.

Then, at time t3 when the word line selecting signal φR is brought to the "H" level, the word driver 87 in FIG. 7 is activated to bring the word line WL corresponding to the predecoding signal X0 to the "H" level of the selection level. Since the N channel MOS transistor 74 in FIG. 6 is non-conductive, the word driver 6 will not be activated, so that the spare word line SWL remains unchanged at the "L" level of the non-selected level. At time t4, when the signals X0 and φR attain the "L" level of the inactivation level, the word line WL attains the "L" level of the non-selected level.

FIGS. 9A to 9F are time charts showing operation conducted when the word line WL corresponding to the predecoding signal X0 is defective and the defective word line WL is selected. In this case, the fuse 70a corresponding to the signal X0 is cut off. Assume here that the signal LTB is at the "L" level of the inactivation level and the N channel MOS transistors 72a to 72d are non-conductive.

Operation conducted before the precharging signal /PC attains the "L" level of the activation level and the nodes N70 and N80 are precharged to the "H" level from time t1 to time 2 is the same as that described with reference to FIGS. 8A to 8F. When the predecoding signal X0 is brought to the "H" level of the activation level at time t2, the N channel MOS transistor 71a in FIG. 6 is rendered conductive, while the hit signal φH remains unchanged at the "H" level because the fuse 70a is cut off.

On the other hand, when the predecoding signal X0 is brought to the "H" level of the activation level, the N channel MOS transistor 80 in FIG. 7 is rendered conductive, so that the node N80 attains the "L" level and the inverter 85 outputs the "H" level. However, since the signal φH is at the "H" level, the N channel MOS transistor 82 is rendered conductive and the gate of the N channel MOS transistor 83 remains unchanged at the "L" level. Accordingly, the N channel MOS transistor 74 in FIG. 6 is rendered conductive, while the N channel MOS transistor 83 in FIG. 7 is not rendered conductive.

Then, at time T3, when the word line selecting signal φR rises to the "H" level of the activation level, the word driver 76 in FIG. 6 is activated to bring the spare word line SWL to the "H" level of the selection level. Since the N channel MOS transistor 83 in FIG. 7 is non-conductive, the word driver 87 is not activated, so that the defective word line WL corresponding to the predecoding signal X0 remains unchanged at the "L" level of the non-selected level. When at time t4, the signals X0 and φR attain the "L" level of the inactivation level, the spare word line SWL attains the "L" level of the non-selected level.

In the pre-LT state return mode, the signal LTB attains the "H" level of the activation level to render the N channel MOS transistors 72a to 72d in FIG. 6 conductive, whereby the redundant row decoder 5 becomes equivalent to a state where none of the fuses 70a to 70d is cut off. In this case, the word line WL corresponding to the row address signal RA0 to RAi is brought to the "H" level irrespective of cut-off of the fuses 70a to 70d. Accordingly, when a memory cell MC corresponding to the row address signal RA0 to RAi is defective, no data writing/reading is normally conducted.

Next, a method of testing the DRAM will be described. First, with numerous DRAM chips formed on a semiconductor wafer, a wafer test is performed. In the wafer test, with a test probe being in contact with a pad of each DRAM chip, the test is performed to determine whether each memory cell MC of each DRAM chip is normal or not under predetermined wafer test conditions.

When there exists a memory cell row containing a defective memory cell MC, the fuse in FIG. 6 (e.g. 70a) corresponding to the memory cell row in question is cut off and the memory cell row is replaced by a spare memory cell row. In addition, a regular external power supply potential VCC is applied to selectively connect the fuses 48 to 51, so that tuning of the internal power supply potential intVCC is conducted.

Thereafter, the semiconductor wafer is vertically and horizontally cut to cut out each DRAM chip, and normal DRAM chips and remedied DRAM chips are accommodated in packages to make products.

Next, a final test of each DRAM product is conducted. At the final test, with each DRAM product mounted on a test board, a test is performed to determine whether each memory cell MC of each DRAM product is normal or not under predetermined final test conditions. Normal DRAM products are shipped and DRAM products whose memory cells MC are newly detected being defective are subjected to a defective mode analysis. Difference in results of the wafer test and the final test derives from different test conditions. While the wafer test is conducted with a test probe being in contact with a pad of each DRAM chip, the final test is conducted with each DRAM product mounted on a test board under more severer conditions than those of actual use. Since it is preferable that results of the wafer test and the final test coincide with each other, results of the final test are analyzed and the analysis results are fed back into the wafer test conditions.

Figure 10:
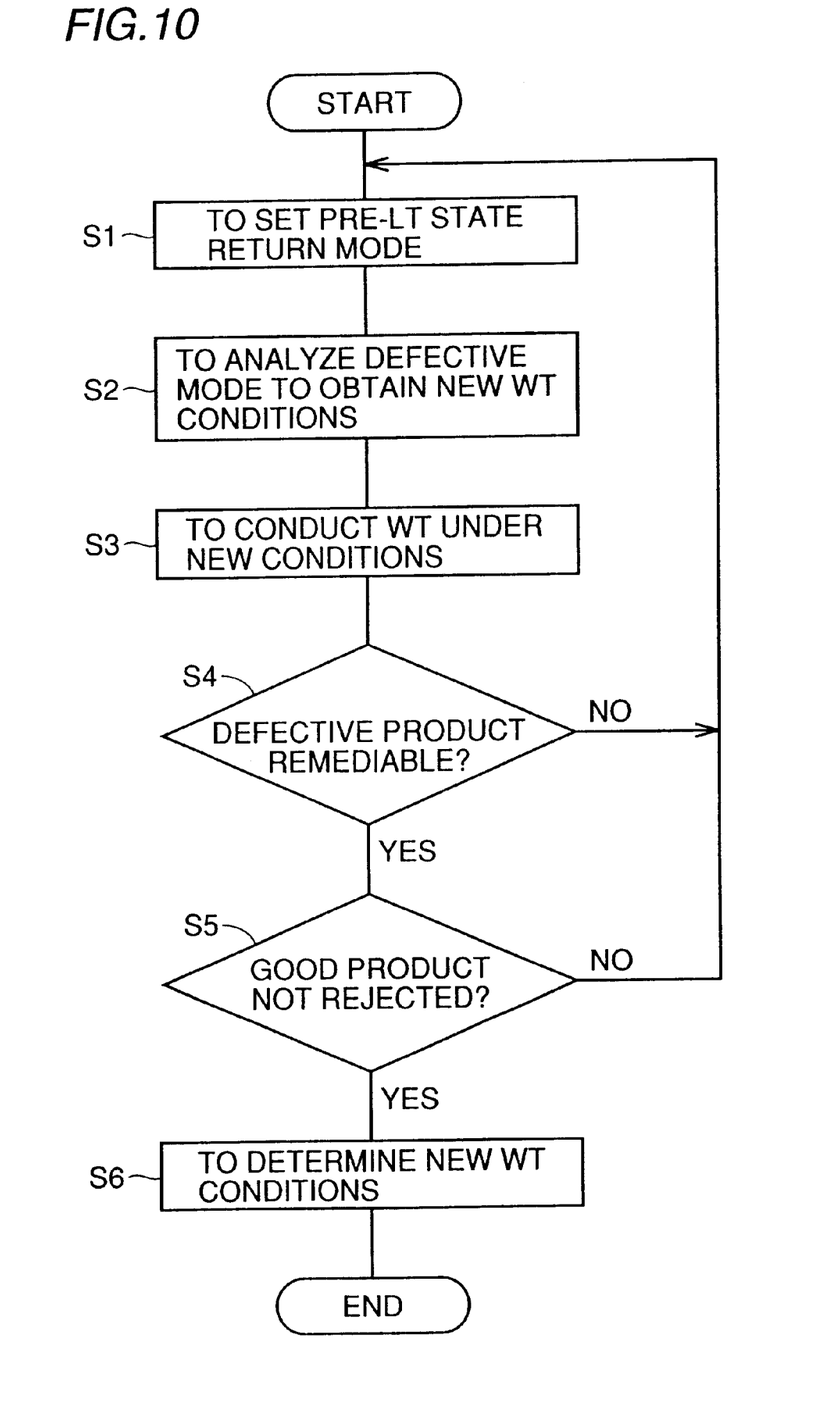
FIG. 10 is a flow chart showing a method of analyzing a defective mode of the DRAM illustrated in FIGS. 1 to 9F.

FIG. 10 is a flow chart showing a method of analyzing the DRAM illustrated in FIGS. 1 to 9F. In FIG. 10, at step S1, set the pre-LT state return mode by an address key. As a result, the signal LTB attains the "H" level of the activation level, so that the N channel MOS transistor 47 in FIG. 4 and the N channel MOS transistors 72a to 72d in FIG. 6 are rendered conductive to return the DRAM to a state before laser trimming, that is, to a state at the wafer test.

Next at Step S2, conduct an analysis of a DRAM defective mode to obtain new wafer test conditions. More specifically, perform a test of a DRAM product to be tested under current wafer test conditions or under various wafer test conditions to compare a test result and a final test result. Then, seek for a new wafer test condition under which the same results as those of the final test are obtained.

Next, at Step S3, with respect to a DRAM product to be tested, perform a test under new wafer test conditions to determine at step S4 whether the defective DRAM product can be remedied at the stage of the wafer test or not. When it can not be remedied, return to Step S2 to analyze a defective mode again to obtain new wafer test conditions. When at Step S4 the determination is made that the product can be remedied, test a DRAM product at step S5 which is determined to be normal at the final test under new wafer test conditions to determine whether the DRAM product is rejected as a defective product or not.

When at step S5 the determination is made that the normal DRAM product is rejected, return to step S2 to again analyze a defective mode and obtain new wafer test conditions. When at step S5 the determination is made that the normal DRAM product is not rejected, determination is made at step S6 that the new wafer test conditions are adopted.

In the present embodiment, since by setting the pre-LT state return mode, a DRAM product can be returned to a state before laser trimming, that is, a state at the wafer test, a defective mode can be accurately analyzed to obtain optimum wafer test conditions. It is therefore possible to drastically reduce an analysis time and improve a yield.

Although the present embodiment has been described with respect to a case where the present invention is applied to a method of replacing a memory cell row containing a defective memory cell by a spare memory cell row, it is clearly understood that the present invention is applicable also to a method of replacing a memory cell column containing a defective memory cell by a spare memory cell column.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an internal power supply voltage generation circuit for generating an internal power supply voltage based on an external power supply voltage,
   at least one first fuse coupled to said internal power supply voltage generation circuit for adjusting a level of said internal power supply voltage through cut-off,
   a first switching element connected to said at least one first fuse in parallel and responsive to an instruction of an initial state return mode to become conductive for returning the level of said internal power supply voltage to an initial value, and
   an internal circuit driven by said internal power supply voltage.

2. The semiconductor device according to claim 1, wherein
   said internal power supply voltage generation circuit includes:
   a constant-current source for outputting a predetermined constant current, and
   a plurality of resistance elements connected in series between an output node of said constant-current source and a line of a reference potential, and
   said at least one first fuse is connected in parallel to any resistance element of said plurality of resistance elements.

3. The semiconductor device according to claim 1, wherein
   said semiconductor device is a semiconductor storage device, and
   said internal circuit includes:
   a plurality of memory cells to each of which an inherent address signal is assigned in advance,
   a spare memory cell for replacing a defective memory cell among said plurality of memory cells, a decoder provided corresponding to each memory cell and responsive to application of an address signal assigned to the corresponding memory cell for activating the corresponding memory cell, a redundant decoder including at least one second fuse for programming an address signal assigned to said defective memory cell through cut-off and responsive to application of an address signal programmed by said at least one second fuse for inactivating said decoder, as well as activating said spare memory cell, a second switching element connected to said at least one second fuse in parallel and responsive to an instruction of said initial state return mode for temporarily erasing a programmed address signal, and a write/read circuit for writing/reading data to/from a memory cell activated by said decoder and a spare memory cell activated by said redundant decoder.

4. A semiconductor storage device testing method, wherein said semiconductor storage device comprises:

a plurality of memory cells to each of which an inherent address signal is assigned in advance, a spare memory cell for replacing a defective memory cell among said plurality of memory cells, a decoder provided corresponding to each memory cell and responsive to application of an address signal assigned to the corresponding memory cell for activating the corresponding memory cell, a redundant decoder including at least one first fuse for programming an address signal assigned to said defective memory cell through cut-off and responsive to application of an address signal programmed by said at least one first fuse for inactivating said decoder, as well as activating said spare memory cell, a first switching element connected to said at least one first fuse in parallel and responsive to an instruction of an initial state return mode for temporarily erasing a programmed address signal, and a write/read circuit for writing/reading data to/from a spare memory cell activated by said decoder and a spare memory cell activated by said redundant decoder, and said method comprises the steps of:

with said semiconductor storage device formed on a semiconductor wafer, performing a test to determine whether each memory cell is normal or not under a first test condition, when a defective memory cell exists, cutting off said at least one first fuse to replace the defective memory cell with the spare memory cell, then cutting out the semiconductor storage device form the semiconductor wafer and accommodating the device into a package, and with the device accommodated, conducting a test to determine whether each memory cell is normal or not under a second test condition, and when a defective memory cell is newly detected, instructing said initial state return mode to render said first switching element conductive and reviewing said first test condition.

5. The semiconductor storage device testing method according to claim 4, wherein said semiconductor storage device comprises:

an internal power supply voltage generation circuit for generating an internal power supply voltage for driving said decoder, said redundant decoder and said write/read circuit based on an external power supply voltage, at least one second fuse coupled to said internal power supply voltage generation circuit for adjusting a level of said internal power supply voltage through cut-off, and a second switching element connected to said at least one second fuse in parallel and responsive to an instruction of the initial state return mode to become conductive for returning the level of said internal power supply voltage to an initial value, and said method comprises the steps of:

at the time of cutting off said at least one first fuse, cutting off said at least one second fuse as well, and at the time of rendering said first switching element conductive, rendering said second switching element as well.

* * * * *